(12) United States Patent
Chiang et al.

(10) Patent No.: US 8,513,886 B1
(45) Date of Patent: Aug. 20, 2013

(54) LIGHT EMITTING DIODE DEVICE

(71) Applicant: Walsin Lihwa Corporation, Taoyuan (TW)

(72) Inventors: Chung-I Chiang, Taoyuan County (TW); Ching-Huan Liao, Taoyuan (TW); Chuan-Fa Lin, Taoyuan (TW)

(73) Assignee: Walsin Lihwa Corporation, Taoyuan (TW)

( * ) Notice: Subject to any disclaimer, the term of this patent is extended or adjusted under 35 U.S.C. 154(b) by 0 days.

(21) Appl. No.: 13/755,087

(22) Filed: Jan. 31, 2013

(30) Foreign Application Priority Data

Jul. 11, 2012   (TW) .............................. 101124981 A

(51) Int. Cl.
*H01J 1/62*            (2006.01)

(52) U.S. Cl.
USPC ............................ 313/512; 313/506; 313/498

(58) Field of Classification Search
USPC .......................................... 313/512, 506, 498
See application file for complete search history.

(56) References Cited

U.S. PATENT DOCUMENTS

| | | |
|---|---|---|
| 2008/0128730 A1 | 6/2008 | Fellows et al. |
| 2010/0244067 A1 | 9/2010 | Winkler et al. |

*Primary Examiner* — Vip Patel
(74) *Attorney, Agent, or Firm* — Rabin & Berdo, P.C.

(57) ABSTRACT

A light emitting diode device is provided. The light emitting diode device comprises a light emitting diode component and an encapsulation layer. The encapsulation layer is disposed surrounding the light emitting diode component. The encapsulation layer comprises an encapsulation gel layer and a plurality of micro-particles distributed in the encapsulation gel layer. The difference between the refractive index of the encapsulation gel layer and the refractive index of the micro-particles is smaller than or equal to 0.05.

18 Claims, 4 Drawing Sheets

LIGHT EMITTING DIODE DEVICE

This application claims the benefit of Taiwan application Serial No. 101124981, filed Jul. 11, 2012, the subject matter of which is incorporated herein by reference.

BACKGROUND OF THE INVENTION

1. Field of the Invention

The invention relates in general to a light emitting diode device, and more particularly to a light emitting diode device with excellent light extraction efficiency.

2. Description of the Related Art

Along with the rapid advance and development of the display technology, the researches and developments of various displays have gained rapidly; meanwhile, the requirements for the functions and characteristics of the displays are also increased. For example, applying phosphors in light emitting diode displays has become a focus in the research of the display technology.

Fluorescent powders are often used in the light emitting diode devices for converting lights. That is, fluorescent powders absorb and convert the light emitted from the light emitting chip of a light emitting diode device into a light with a different wavelength. Suitable types of fluorescent powders can be selected for use in light emitting diode devices according to the needs. Further, the light converted by fluorescent powders can be mixed with the light emitted from the light emitting chip to form a different light. A light emitting diode component that can emit white light is one of the examples.

In a light emitting diode device, when a light emitted by the light emitting chip encounters phosphor particles in the proceeding course, two scenarios may happen. The first scenario is that the angle formed between the light and the surface of the phosphor particles is smaller than a critical angle. Under such circumstance, a scattering effect will happen when the light passes through the phosphor particles and a scattering light will be formed and emitted by the phosphor particles. The scattering light is further divided into a forward scattering light and a backward scattering light. The forward scattering light continues to proceed to the light emitting surface of the light emitting diode device. The backward scattering light is reflected towards to the light emitting chip and transfers into the light energy which being absorbed by the light emitting chip or the light emitting diode device. As a result, an energy loss occurs and the light extraction efficiency of the display is reduced. The second scenario is that the angle formed between the light and the surface of the phosphor particles is larger than a critical angle. Under such circumstance, the light will be totally reflected when reaching the surface of the phosphor particles, and becomes a total reflective light reflected towards to the light emitting chip. Likewise, the reflected light is absorbed by the light emitting chip or the light emitting diode device. As a result, an energy loss is resulted and the light extraction efficiency of the display is reduced. Therefore, how to provide a light emitting diode device with excellent light extraction efficiency has become a prominent task for the industries.

SUMMARY OF THE INVENTION

The invention is directed to a light emitting diode device, of which the luminous efficiency is increased through the difference between the refractive index of the encapsulation gel layer and the refractive index of the micro-particles in the encapsulation gel layer being smaller than or equal to 0.05.

According to an embodiment of the present invention, a light emitting diode device is provided. The light emitting diode device comprises a light emitting diode component and an encapsulation layer. The encapsulation layer is disposed surrounding the light emitting diode component. The encapsulation layer comprises an encapsulation gel layer and a plurality of micro-particles distributed in the encapsulation gel layer. The difference between the refractive index of the encapsulation gel layer and the refractive index of the micro-particles is smaller than or equal to 0.05.

According to another embodiment of the present invention, a light emitting diode device is provided. The light emitting diode device comprises a light emitting diode component, an encapsulation layer, and a phosphor layer. The encapsulation layer is disposed surrounding the light emitting diode. The encapsulation layer comprises an encapsulation gel layer and a plurality of micro-particles. The phosphor layer is disposed on the encapsulation layer, and comprises a phosphor gel layer and a plurality of the phosphor particles. The difference between the refractive index of the phosphor gel layer and the refractive index of the phosphor particles is smaller than or equal to 0.05.

The above and other aspects of the invention will become better understood with regard to the following detailed description of the preferred but non-limiting embodiment(s). The following description is made with reference to the accompanying drawings.

DETAILED DESCRIPTION OF THE INVENTION

A light emitting diode device is disclosed in a number of embodiments below. By controlling the difference between the refractive index of the encapsulation gel layer and the refractive index of the micro-particles in the encapsulation gel layer to be smaller than or equal to 0.05, the light extraction efficiency of the light emitting diode device is increased. However, detailed structures disclosed in the embodiments of the invention are for detailed descriptions only, not for limiting the scope of protection of the invention. Anyone who is skilled in the technology of the present invention will be able to made necessary modifications or variations based on actual needs of implementations.

Figure 1:
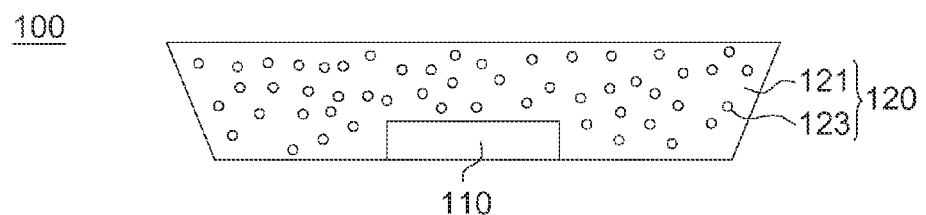
FIG. 1 shows a schematic diagram of a light emitting diode device according to a first embodiment of the present invention.

Referring to FIG. 1, a schematic diagram of a light emitting diode device 100 according to a first embodiment of the present invention is shown. The light emitting diode device 100 comprises a light emitting diode component 110 and an encapsulation layer 120. The encapsulation layer 120 is disposed surrounding the light emitting diode component 110. In other words, the encapsulation layer 120 is disposed on the light emitting diode component 110 and covers the light emitting diode component 110. The encapsulation layer 120 comprises an encapsulation gel layer 121 and a plurality of micro-particles 123 distributed in the encapsulation gel layer 121. When the difference between the refractive index of the encapsulation gel layer 121 and the refractive index of the micro-particles 123 is smaller than or equal to 0.05, the backward scattering generated when the light emitted from the light emitting diode component 110 passes through the micro-particles 123 is effectively reduced, and the forward scattering generated when the light emitted from the light emitting diode component 110 passes through the micro-particles 123 is increased. As a result, less light energy is absorbed by the light emitting diode component 110 or the encapsulation layer 120, less energy loss is resulted, and hence the light extraction efficiency of the light emitting diode device 100 is increased.

In an embodiment, the micro-particles 123 may be formed of a light transmissive material. When the refractive index of the micro-particles 123 is equal to 1.41, the refractive index of the encapsulation gel layer 121 may be between 1.36~1.46. In another embodiment, the difference between the refractive index of the encapsulation gel layer 121 and the refractive index of the micro-particles 123 may be larger than 0 and smaller than or equal to 0.03. That is, when the refractive index of the micro-particles 123 is equal to 1.41, the refractive index of the encapsulation gel layer 121 is between 1.38~1.44 but not equal to 1.41.

In an embodiment, the micro-particles 123 may be phosphor particles. When the micro-particles 123 are phosphor particles and the refractive index of the micro-particles 123 is equal to 1.83, the refractive index of the encapsulation gel layer 121 may be between 1.78~1.88. In another embodiment, the difference between the refractive index of the encapsulation gel layer 121 and the refractive index of the micro-particles 123 may be larger than 0 and smaller than or equal to 0.03. That is, when the micro-particles 123 are phosphor particles and the refractive index of the micro-particles 123 is equal to 1.83, the refractive index of the encapsulation gel layer 121 is between 1.80~1.86 but not equal to 1.83.

Figure 2:
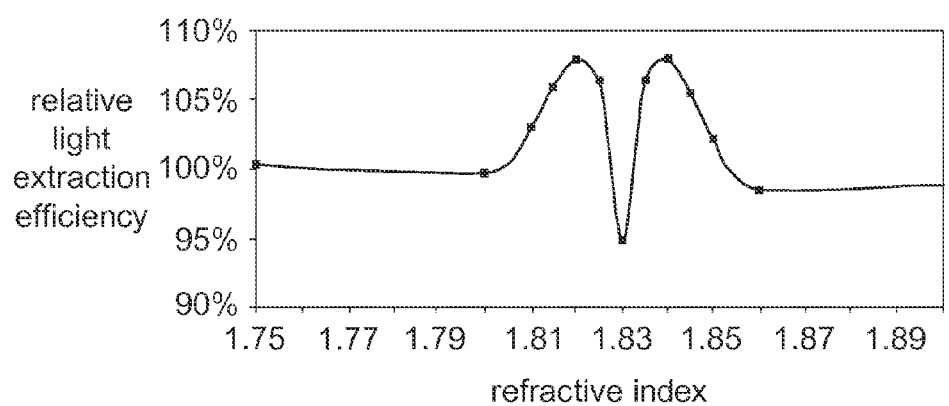
FIG. 2 shows a curve diagram illustrating the relationship between the refractive index of the encapsulation gel layer and the relative light extraction efficiency according to the first embodiment of the present invention.

Referring to FIG. 2, a curve diagram illustrating the relationship between the refractive index of the encapsulation gel layer and the relative light extraction efficiency according to the first embodiment of the present invention is shown. The horizontal axis denotes the refractive index of the encapsulation gel layer 121, and the vertical axis denotes relative light extraction efficiency of the emitting diode device 100. The relative light extraction efficiency is obtained by using the refractive index of the encapsulation gel layer 121 equals to 1.41 as a standard of reference. That is, the relative light extraction efficiency under this circumstance is defined to be 100%. In this embodiment, the micro-particles 123 are phosphor particles whose refractive index is equal to 1.83 and particle size is equal to 6 micrometers ($\mu m$).

When the refractive index of the encapsulation gel layer 121 is about 1.82 or 1.84, the difference between the refractive index of the encapsulation gel layer 121 and the refractive index of the micro-particles 123 is about 0.01; meanwhile, the relative light extraction efficiency is greatly increased to 108%. The refractive index of the encapsulation gel layer 121 is not limited to 1.82 or 1.84, and other material whose refractive index is about 1.80.1.86 but not equal to 1.83 can also be used. When the difference between the refractive index of the encapsulation gel layer 121 and the refractive index of the micro-particles 123 is about larger than 0 and smaller than or equal to 0.03, the relative extraction efficiency will be larger than 100%.

In an embodiment, the particle size of the micro-particles 123 may be smaller than or equal to 15 $\mu m$. In an embodiment, the particle size of the micro-particles 123 may be smaller than or equal to 10 $\mu m$. In an embodiment, the particle size of the micro-particles 123 may be smaller than or equal to 6 $\mu m$. In an embodiment, the particle size of the micro-particles 123 may be smaller than or equal to 3 $\mu m$. In an embodiment, the particle size of the micro-particles 123 may be smaller than or equal to 1 $\mu m$.

Figure 3:
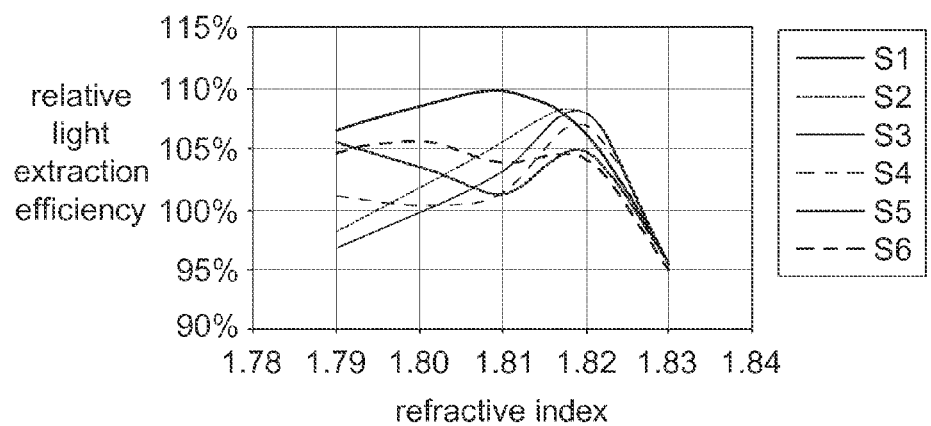
FIG. 3 shows a curve diagram illustrating the relationship between the refractive index of the encapsulation gel layer and the relative light extraction efficiency when the micro-particles have different particle sizes according to the first embodiment of the present invention.

Referring to FIG. 3, a curve diagram illustrating the relationship between the refractive index of the encapsulation gel layer and the relative light extraction efficiency when the micro-particles have different particle sizes according to the first embodiment of the present invention is shown. The horizontal axis denotes the refractive index of the encapsulation gel layer 121, and the vertical axis denotes the relative light extraction efficiency of the emitting diode device 100. The relative light extraction efficiency is obtained by using the refractive index of the encapsulation gel layer 121 equals to 1.41 as a standard of reference. That is, the relative light extraction efficiency under this circumstance is defined to be 100%. In this embodiment, the micro-particles 123 are phosphor particles whose refractive index is equal to 1.83. In FIG. 3, curves S1, S2, S3, S4, S5, and S6 denote the relationships between the refractive index of the encapsulation gel layer and the relative light extraction efficiency when the particle size of the micro-particles 123 is equal to 1 $\mu m$, 3 $\mu m$, 6 $\mu m$, 10 $\mu m$, 15 $\mu m$, and 20 $\mu m$, respectively.

When the refractive index of the encapsulation gel layer 121 is about 1.81, the difference between the refractive index of the encapsulation gel layer 121 and the refractive index of the micro-particles 123 is about 0.02. When the particle size of the micro-particles 123 is equal to 1 $\mu m$ (curve S1) and 3 $\mu m$ (curve S2), the relative light extraction efficiency can be greatly increased to be equal to 110% and larger than 105%, respectively.

When the refractive index of the encapsulation gel layer 121 is about 1.82, the difference between the refractive index of the encapsulation gel layer 121 and the refractive index of the micro-particles 123 is about 0.01, and hence the relative light extraction efficiencies obtained when the particle size of the micro-particles 123 is between 1 $\mu m$ (curve S1)~20 $\mu m$ (curve S6) are all larger than 100%. Given the above, when a suitable range of particle size of the micro-particles 123 is taken in conjunction with a suitable range of difference between the refractive index of the encapsulation gel layer 121 and the refractive index of the micro-particles 123, the forward scattering generated when the light emitted from the light emitting diode component 110 passes through the micro-particles 123 can be increased. As a result, less light energy is absorbed by the light emitting diode component 110 or the encapsulation layer 120, and less energy loss is resulted, hence increasing the light extraction efficiency of the display.

Figure 4:
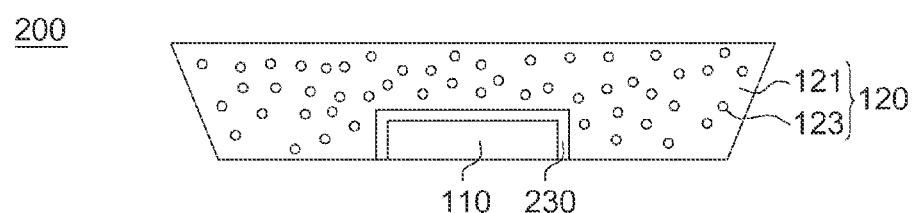
FIG. 4 shows a schematic diagram of a light emitting diode device according to a second embodiment of the present invention.

FIG. 4 shows a schematic diagram of a light emitting diode device according to a second embodiment of the present invention. The components common to the present embodiment and the above disclosed embodiments retain the same numeric designation. Common reference numerals are used throughout the drawings and the detailed description to indicate the same elements, and the similarities are not repeated here.

Referring to FIG. 4, the light emitting diode device 200 comprises a light emitting diode component 110, an encapsulation layer 120, and a phosphor layer 230. The encapsulation layer 120 is disposed surrounding the light emitting diode component 110. The encapsulation layer 120 comprises an encapsulation gel layer 121 and a plurality of micro-particles 123 distributed in the encapsulation gel layer 121. The difference between the refractive index of the encapsulation gel layer 121 and the refractive index of the micro-particles 123 is smaller than or equal to 0.05. The phosphor layer 230 is disposed between the light emitting diode component 110 and the encapsulation layer 120.

In an embodiment, the micro-particles 123 may be transparent resin particles, and the phosphor layer 230 may be formed from a phosphor gel layer and a plurality of phosphor particles distributed in the phosphor gel layer (not illustrated). When the difference between the refractive index of the phosphor gel layer and the refractive index of the phosphor particles is smaller than or equal to 0.05, regardless of whether the difference between the refractive index of the encapsulation gel layer 121 and the refractive index of the micro-particles 123 is smaller than or equal to 0.05 or not, and regardless of whether the encapsulation gel layer 121 comprises micro-particles 123 (not illustrated) or not, the backward scattering generated when the light emitted from the light emitting diode component 110 passes through the phosphor particles is effectively reduced, and the forward scattering generated when the light emitted from the light emitting diode component 110 passes through the phosphor particles is increased. The energy loss caused by the light being absorbed by the light emitting diode component 110, the phosphor layer 230 or the encapsulation layer 120 is reduced, and the light extraction efficiency of the display is increased thereby.

Figure 5:
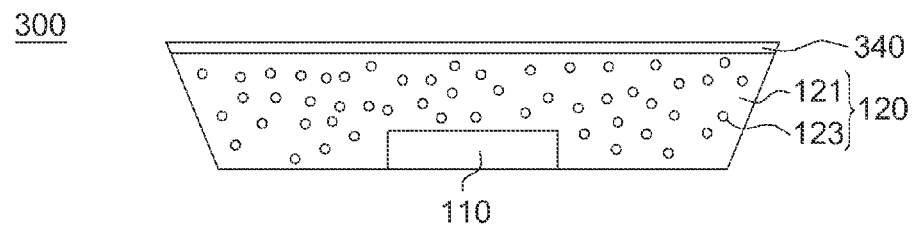
FIG. 5 shows a schematic diagram of a light emitting diode device according to a third embodiment of the present invention.

FIG. 5 shows a schematic diagram of a light emitting diode device according to a third embodiment of the present invention. The components common to the present embodiment and the above disclosed embodiments retain the same numeric designation. Common reference numerals are used throughout the drawings and the detailed description to indicate the same elements, and the similarities are not repeated here.

Referring to FIG. 5, the light emitting diode device 300 comprises a light emitting diode component 110 and an encapsulation layer 120. The encapsulation layer 120 is disposed surrounding the light emitting diode component 110. The encapsulation layer 120 is formed by an encapsulation gel layer 121 and a plurality of micro-particles 123 distributed in the encapsulation gel layer 121. The difference between the refractive index of the encapsulation gel layer 121 and the refractive index of the micro-particles 123 is smaller than or equal to 0.05. In the present embodiment, the micro-particles 123 may be phosphor particles.

The light emitting diode device 300 can further comprise a microstructure layer 340 disposed on a top side of the encapsulation layer 120 for improving the light extraction efficiency. The microstructure layer 340 can be a film whose surface has regular or irregular microstructures, or the microstructure layer 340 can be directly formed on the top side of the encapsulation layer 120, such as by coarsening the top side of the encapsulation layer 120 by an etching process.

Figure 6:
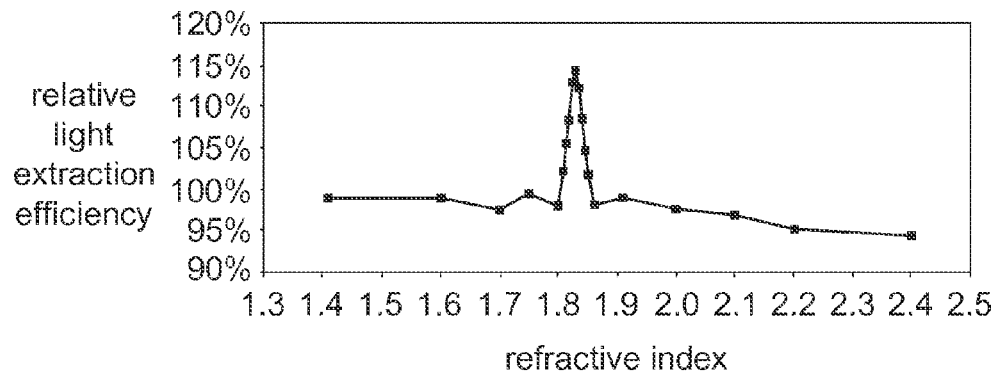
FIG. 6 shows a curve diagram illustrating the relationship between the refractive index of the encapsulation gel layer and the relative light extraction efficiency according to the third embodiment of the present invention.

Referring to FIG. 6, a curve diagram illustrating the relationship between the refractive index of the encapsulation gel layer and the relative light extraction efficiency according to a third embodiment of the present invention is shown. The micro-particles 123 are phosphor particles whose refractive index is equal to 1.83. The horizontal axis denotes the refractive index of the encapsulation gel layer 121, and the vertical axis denotes the relative light extraction efficiency of the emitting diode device 100. The relative light extraction efficiency is obtained by using the refractive index of the encapsulation gel layer 121 equals to 1.41 as a standard of reference. That is, the relative light extraction efficiency under this circumstance is defined to be 100%. When the microstructure layer 340 is disposed on the top side of the encapsulation layer 120 and the difference between the refractive index of the encapsulation gel layer 121 and the refractive index of the micro-particles 123 is equal to 0, the relative light extraction efficiency is greatly increased to 115%. Alternatively, when the refractive index of the encapsulation gel layer 121 is larger than 1.80 but smaller than 1.86, that is, when the difference between the refractive index of the encapsulation gel layer 121 and the refractive index of the micro-particles 123 (the phosphor particles) is about smaller than 0.03, the relative light extraction efficiency will be larger than 100%.

Figure 7:
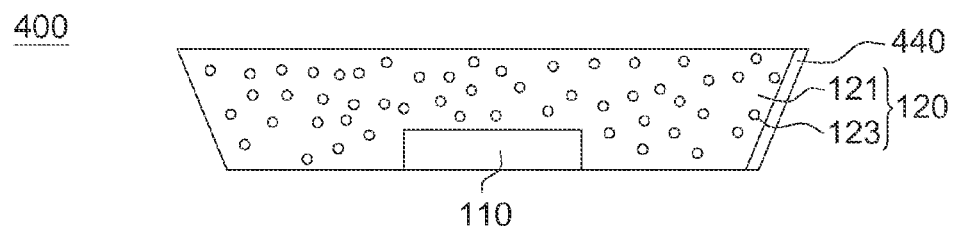
FIG. 7 shows a schematic diagram of a light emitting diode device according to a fourth embodiment of the present invention.

FIG. 7 shows a schematic diagram of a light emitting diode device according to a fourth embodiment of the present invention. The components common to the present embodiment and the above disclosed embodiments retain the same numeric designation. Common reference numerals are used throughout the drawings and the detailed description to indicate the same elements, and the similarities are not repeated here. Referring to FIG. 7, the light emitting diode device 400 comprises a light emitting diode component 110, an encapsulation layer 120, and a microstructure layer 440. The encapsulation layer 120 is disposed surrounding the light emitting diode component 110 and comprises an encapsulation gel layer 121 and a plurality of micro-particles 123 distributed in the encapsulation gel layer 121. The microstructure layer 440 is disposed on a lateral side of the encapsulation layer 120. Similarly, the micro-particles 123 may be phosphor particles. The difference between the refractive index of the encapsulation gel layer 121 and the refractive index of the micro-particles 123 is smaller than or equal to 0.05.

Similarly, the microstructure layer 440 can be a film whose surface has regular or irregular microstructures disposed on a lateral side of the encapsulation layer 120, or the microstructure layer 440 can be directly formed on the lateral side of the encapsulation layer 120, such as by coarsening the lateral side of the encapsulation layer 120 by an etching process.

Figure 8:
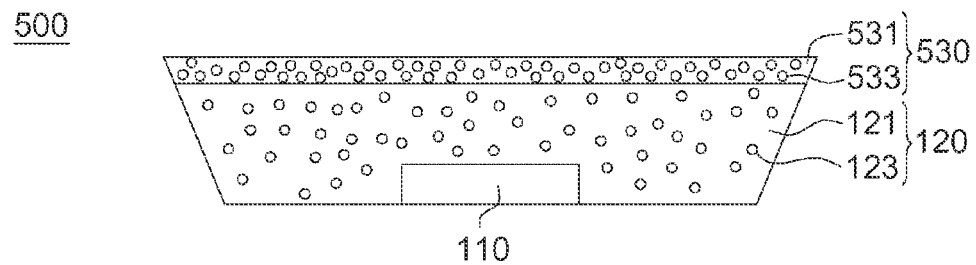
FIG. 8 shows a schematic diagram of a light emitting diode device according to a fifth embodiment of the present invention.

FIG. 8 shows a schematic diagram of a light emitting diode device according to a fifth embodiment of the present invention. The components common to the present embodiment and the above disclosed embodiments retain the same numeric designation. Common reference numerals are used throughout the drawings and the detailed description to indicate the same elements, and the similarities are not repeated here. Referring to FIG. 8, the light emitting diode device 500 comprises a light emitting diode component 110, an encapsulation layer 120, and a phosphor layer 530. The encapsulation layer 120 is disposed surrounding the light emitting diode component 110. The encapsulation layer 120 comprises an encapsulation gel layer 121 and a plurality of micro-particles 123 distributed in the encapsulation gel layer 121. The phosphor layer 530 is disposed on the encapsulation layer 120. The phosphor layer 530 comprises a phosphor gel layer 531 and a plurality of phosphor particles 533 distributed in the phosphor gel layer 531. The difference between the refractive index of the phosphor gel layer 531 and the refractive index of the phosphor particles 531 is smaller than or equal to 0.05. When the difference between the refractive index of the phosphor gel layer 531 and the refractive index of the phosphor particles 533 is smaller than or equal to 0.05, the backward scattering generated when the light emitted from the light emitting diode component 110 passes through the phosphor particles 533 is effectively reduced, and the forward scattering generated when the light emitted from the light emitting diode component 110 passes through the phosphor particles 533 is increased. As a result, less light energy is absorbed by the light emitting diode component 110 or the phosphor layer 530, and less energy loss is resulted, hence increasing the light extraction efficiency of the display.

In an embodiment, when the refractive index of the phosphor particles 533 is equal to 1.83, the refractive index of the phosphor gel layer 531 is between 1.78~1.88. In another embodiment, the difference between the refractive index of the encapsulation gel layer 121 and the refractive index of the micro-particles 123 may be larger than 0 and smaller than or equal to 0.03. That is, when the refractive index of the phosphor particles 533 is equal to 1.83, the refractive index of the phosphor gel layer 531 is between 1.80~1.86 but not equal to 1.83.

In an embodiment, the micro-particles 123 may be transparent resin particles. In an embodiment, the difference between the refractive index of the encapsulation gel layer 121 and the refractive index of the micro-particles 123 may be smaller than or equal to 0.05. In another embodiment, the difference between the refractive index of the encapsulation gel layer 121 and the refractive index of the micro-particles 123 may be larger than 0 and smaller than or equal to 0.03.

In an embodiment, the particle size of the phosphor particles 533 may be smaller than or equal to 15 μm. In an embodiment, the particle size of the micro-particles 123 may be smaller than or equal to 15 μm.

In an embodiment, when the difference between the refractive index of the phosphor gel layer 531 and the refractive index of the phosphor particles 533 is smaller than or equal to 0.05 and the difference between the refractive index of the encapsulation gel layer 121 and the refractive index of the micro-particles 123 is smaller than or equal to 0.05, the backward scattering generated when the light emitted from the light emitting diode component 110 passes through the phosphor particles 533 and the micro-particles 123 is more effectively reduced and the forward scattering generated when the light emitted from the light emitting diode component 110 passes through the phosphor particles 533 and the micro-particles 123 is increased. As a result, less light energy is absorbed by the light emitting diode component 110, the phosphor layer 530, or the encapsulation layer 120, and less energy loss is resulted, hence increasing the light extraction efficiency of the display. However, the present invention is not limited thereto, and the combination of the difference between the refractive index of the phosphor gel layer 531 and the refractive index of the phosphor particles 533 and the difference between the refractive index of the encapsulation gel layer 121 and the refractive index of the micro-particles 123 are based on the needs of actual application and are not limited the above conditions.

Figure 9:
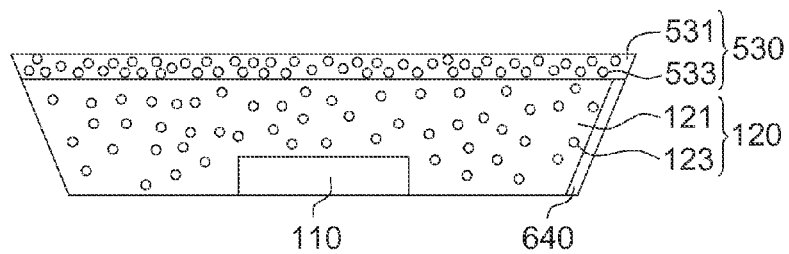
FIG. 9 shows a schematic diagram of a light emitting diode device according to a sixth embodiment of the present invention.
Figure 10:
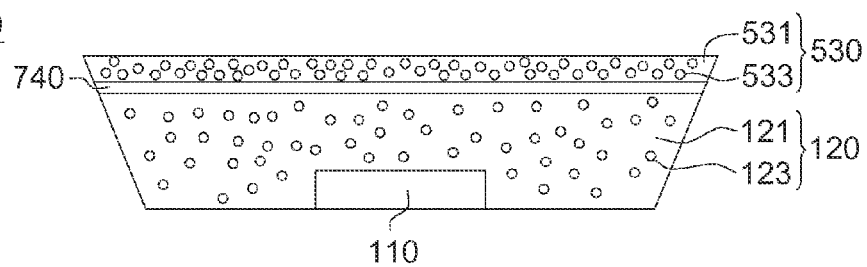
FIG. 10 shows a schematic diagram of a light emitting diode device according to a seventh embodiment of the present invention.
Figure 11:
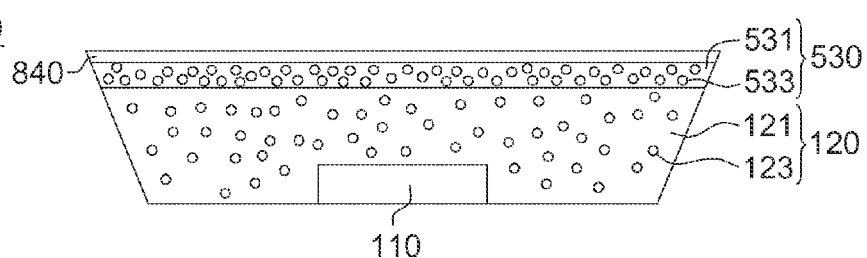
FIG. 11 shows a schematic diagram of a light emitting diode device according to an eighth embodiment of the present invention.

FIG. 9 shows a schematic diagram of a light emitting diode device according to a sixth embodiment of the present invention. FIG. 10 shows a schematic diagram of a light emitting diode device according to a seventh embodiment of the present invention. FIG. 11 shows a schematic diagram of a light emitting diode device according to an eighth embodiment of the present invention. The components common to the present embodiment and the above disclosed embodiments retain the same numeric designation. Common reference numerals are used throughout the drawings and the detailed description to indicate the same elements, and the similarities are not repeated here.

Referring to FIG. 9, the light emitting diode device 600 comprises a light emitting diode component 110, an encapsulation layer 120, and a phosphor layer 530. The encapsulation layer 120 is disposed surrounding the light emitting diode component 110 and comprises an encapsulation gel layer 121 and a plurality of micro-particles 123 distributed in the encapsulation gel layer 121. The phosphor layer 530 is disposed on the encapsulation layer 120 and comprises a phosphor gel layer 531 and a plurality of phosphor particles 533 distributed in the phosphor gel layer 531. The difference between the refractive index of the phosphor gel layer 531 and the refractive index of the phosphor particles 531 is smaller than or equal to 0.05. The light emitting diode device 600 of the present embodiment can further comprise a microstructure layer 640 disposed on a lateral side of the encapsulation layer 120. The microstructure layer 640 can be a film whose surface has regular or irregular microstructures, or the microstructure layer 640 can be directly formed on the lateral side of the encapsulation layer 120 such as by coarsening the lateral side of the encapsulation layer 120 by an etching process.

Referring to FIG. 10, the light emitting diode device 700 comprises a light emitting diode component 110, an encapsulation layer 120, a phosphor layer 530, and a microstructure layer 740. The microstructure layer 740 is disposed on a top side of the encapsulation layer 120. In the present embodiment, the microstructure layer 740 is disposed between the phosphor layer 530 and the encapsulation layer 120. The microstructure layer 740 can be a film whose surface has regular or irregular microstructures, or the microstructure layer 740 can be directly formed on the top side of the encapsulation layer 120 such as by coarsening the top side of the encapsulation layer 120 by an etching process.

Referring to FIG. 11, the light emitting diode device 800 comprises a light emitting diode component 110, an encapsulation layer 120, a phosphor layer 530, and a microstructure layer 840. The microstructure layer 840 is disposed on the phosphor layer 530. The microstructure layer 840 can be a film whose surface has regular or irregular microstructures, or the microstructure layer 840 can be directly formed on the top side of the phosphor layer 530 such as by coarsening the top side of the phosphor layer 530 by an etching process.

By controlling the difference between the refractive index of the encapsulation gel layer and the refractive index of the micro-particles in the encapsulation gel layer of the light emitting diode devices disclosed in the above embodiments to be smaller than or equal to 0.05, the backward scattering generated when the light emitted from the light emitting diode component passes through the micro-particles is reduced and the forward scattering generated when the light passes through the micro-particles is increased, hence increasing the light extraction efficiency of the light emitting diode devices. Moreover, when the difference between the refractive index of the phosphor gel layer and the refractive index of the phosphor particles is smaller than or equal to 0.05, the backward scattering generated when the light emitted from the light emitting diode component passes through the phosphor particles can be reduced and the forward scattering generated when the light passes through the phosphor particles can be increased, hence increasing the light extraction efficiency of the light emitting diode devices. In addition, the microstructure layer which is disposed on the phosphor layer, a lateral side or a top side of the encapsulation layer can increase the light extraction efficiency of the light emitting diode devices.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting diode device, comprising:
   a light emitting diode component; and
   an encapsulation layer disposed surrounding the light emitting diode component, wherein the encapsulation layer comprises an encapsulation gel layer and a plurality of micro-particles distributed in the encapsulation gel layer, and the difference between the refractive index of the encapsulation gel layer and the refractive index of the micro-particles is smaller than or equal to 0.05.

2. The light emitting diode device according to claim 1, wherein the difference between the refractive index of the encapsulation gel layer and the refractive index of the micro-particles is larger than 0 and smaller than or equal to 0.03.

3. The light emitting diode device according to claim 1, wherein the difference between the refractive index of the encapsulation gel layer and the refractive index of the micro-particles is equal to 0.

4. The light emitting diode device according to claim 1, further comprising a microstructure layer disposed on a lateral side or a top side of the encapsulation layer.

5. The light emitting diode device according to claim 1, wherein the particle size of the micro-particles is smaller than or equal to 15 micrometers (μm).

6. The light emitting diode device according to claim 1, further comprising a phosphor layer disposed between the light emitting diode component and the encapsulation layer.

7. The light emitting diode device according to claim 6, wherein the difference between the refractive index of the encapsulation gel layer and the refractive index of the micro-particles is larger than 0 and smaller than or equal to 0.03.

8. The light emitting diode device according to claim 6, wherein the difference between the refractive index of the encapsulation gel layer and the refractive index of the micro-particles is equal to 0.

9. The light emitting diode device according to claim 6, further comprising a microstructure layer disposed on a lateral side or a top side of the encapsulation layer.

10. The light emitting diode device according to claim 6, wherein the particle size of the micro-particles is smaller than or equal to 15 micrometers (μm).

11. The light emitting diode device according to claim 1, wherein the micro-particles are phosphor particles.

12. A light emitting diode device, comprising:
    a light emitting diode component;
    an encapsulation layer disposed surrounding the light emitting diode, wherein the encapsulation layer comprises an encapsulation gel layer and a plurality of micro-particles; and
    a phosphor layer disposed on the encapsulation layer, wherein the phosphor layer comprises a phosphor gel layer and a plurality of the phosphor particles, and the difference between the refractive index of the phosphor gel layer and the refractive index of the phosphor particles is smaller than or equal to 0.05.

13. The light emitting diode device according to claim 12, wherein the difference between the refractive index of the phosphor gel layer and the refractive index of the phosphor particles is larger than 0 and smaller than or equal to 0.03.

14. The light emitting diode device according to claim 12, wherein the difference between the refractive index of the encapsulation gel layer and the refractive index of the micro-particles is smaller than or equal to 0.05.

15. The light emitting diode device according to claim 14, wherein the difference between the refractive index of the encapsulation gel layer and the refractive index of the micro-particles is larger than 0 and smaller than or equal to 0.03.

16. The light emitting diode device according to claim 12, wherein the particle size of the micro-particles or the phosphor particles is smaller than or equal to 15 μm.

17. The light emitting diode device according to claim 12, wherein the difference between the refractive index of the encapsulation gel layer and the refractive index of the micro-particles or the difference between the refractive index of the phosphor gel layer and the refractive index of the phosphor particles is equal to 0.

18. The light emitting diode device according to claim 12, further comprising a microstructure layer disposed on a lateral side or a top side of the phosphor layer or the encapsulation layer.

* * * * *